(12) United States Patent
Ma et al.

(10) Patent No.: US 12,743,017 B2
(45) Date of Patent: Sep. 22, 2026

(54) METHOD FOR CORRECTING LITHOGRAPHY PATTERN OF SURFACE PLASMA

(71) Applicant: INSTITUTE OF MICROELECTRONICS, CHINESE ACADEMY OF SCIENCES, Beijing (CN)

(72) Inventors: Le Ma, Beijing (CN); Yayi Wei, Beijing (CN); Libin Zhang, Beijing (CN); Jianfang He, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 590 days.

(21) Appl. No.: 18/262,035

(22) PCT Filed: Nov. 2, 2021

(86) PCT No.: PCT/CN2021/128055
§ 371 (c)(1),
(2) Date: Jul. 19, 2023

(87) PCT Pub. No.: WO2023/077253
PCT Pub. Date: May 11, 2023

(65) Prior Publication Data

US 2024/0077799 A1 Mar. 7, 2024

(51) Int. Cl.
*G03F 1/44* (2012.01)
*G03F 1/72* (2012.01)
*G03F 7/20* (2006.01)

(52) U.S. Cl.
CPC .................. *G03F 1/44* (2013.01); *G03F 1/72* (2013.01); *G03F 7/20* (2013.01)

(58) Field of Classification Search
CPC ..... G03F 1/44; G03F 1/72; G03F 7/20; G03F 1/36; H10P 76/00
See application file for complete search history.

(56) References Cited

U.S. PATENT DOCUMENTS 10,663,855 B2 5/2020 Li et al.
2005/0233262 A1* 10/2005 Luo ........................ B82Y 10/00
430/311

(Continued)

FOREIGN PATENT DOCUMENTS

CN 106647163 A 5/2017
CN 110716386 A 1/2020

(Continued)

OTHER PUBLICATIONS

International Search Report (in English) and Written Opinion for International Application No. PCT/CN2021/128055, dated Jun. 1, 2022, 8 pages.

(Continued)

*Primary Examiner* — Stewart A Fraser
(74) *Attorney, Agent, or Firm* — Westman, Champlin & Koehler, P.A.

(57) ABSTRACT

Provided is a method for correcting a lithography pattern of a surface plasma, including: forming a plurality of test patterns on a test mask; exposing a photoresist layer by using the test mask containing the test patterns to form a plurality of photoresist patterns; establishing a first data table based on a correspondence between the first test parameter and the second test parameter of the test pattern and the first exposure parameter and the second exposure parameter of the photoresist pattern; processing the first data table according to the first exposure parameter to obtain a second data table; and respectively correcting second test parameters of a plurality of design patterns according to the second data (Continued)

table to obtain corrected design patterns, and manufacturing a mask for exposure by using the corrected design patterns.

8 Claims, 2 Drawing Sheets

(56) References Cited

U.S. PATENT DOCUMENTS

| | | | | |
|---|---|---|---|---|
| 2017/0363951 | A1* | 12/2017 | Tyminski | G03F 1/68 |
| 2018/0012813 | A1* | 1/2018 | Jaschinsky | H10P 74/23 |
| 2018/0224738 | A1 | 8/2018 | Li et al. | |

FOREIGN PATENT DOCUMENTS

| | | | |
|---|---|---|---|
| CN | 111430261 | A | 7/2020 |
| JP | 2005310958 | A | 11/2005 |

OTHER PUBLICATIONS

Sang-Kon Kim, "Plasmonic computational lithography for below 10-nm patterning," Proc. SPIE 11462, Plasmonics: Design, Materials, Fabrication, Characterization, and Applications XVIII, 114622Y (Aug. 20, 2020); doi: 10.1117/12.2570752.

Nicholas Fang et al., "Sub-Diffraction-Limited Optical Imaging with a Silver Superlens," Science, vol. 308, 534, Apr. 22, 2005, DOI: 10.1126/science.1108759.

Xiangang Luo et al., "Surface plasmon resonant interference nanolithography technique," Applied Physics Letters, vol. 84, No. 23, 4780, Jun. 7, 2004; doi: 10.1063/1.1760221.

* cited by examiner

METHOD FOR CORRECTING LITHOGRAPHY PATTERN OF SURFACE PLASMA

CROSS-REFERENCE TO RELATED APPLICATION

This application is a Section 371 National Stage Application of International Application No. PCT/CN2021/128055, filed on Nov. 2, 2021, entitled "METHOD FOR CORRECTING LITHOGRAPHY PATTERN OF SURFACE PLASMA", which published as WO 2023/077253 A1, on May 11, 2023, not in English, the contents of which are hereby incorporated by reference in their entireties.

TECHNICAL FIELD

The present disclosure relates to a field of semiconductor lithography technology, and in particular, to a method for correcting a lithography pattern of a surface plasma.

BACKGROUND

As a key technology in integrated circuit manufacturing, a lithography technology determines the minimum size that an entire integrated circuit manufacturing process may achieve. The main purpose of a lithography process is to transfer a design pattern on a mask to a silicon wafer. In a traditional lithography, a light source is used to illuminate a mask with a design pattern that needs to be transferred, and the design pattern on the mask is projected onto a photoresist through a projection system. After exposure, the photoresist undergoes a chemical reaction, and then a photoresist pattern related to the design pattern on the mask is obtained on the silicon wafer after steps such as baking, developing and cleaning, etc. However, due to a constraint of an optical diffraction limit, a resolution of the lithography technology may usually only reach a half-wavelength level.

With a development of a near-field optic, manipulation and adjustment of an evanescent wave become possible, and a method for breaking through a diffraction limit represented by a surface plasmon-based lithography technology has been gradually applied in a manufacturing process of an integrated circuit. A surface plasmon-based lithography technology uses a variety of film structures without the use of a complex lens. Using the surface plasmon-based lithography technology, a lithographic image with a wavelength size much smaller than a wavelength size of the light source may be achieved with a large wavelength. However, an exposure is performed by using the surface plasmon-based lithography technology, and due to a complex principle of plasma lithography and many influencing factors, there is an error between an obtained photoresist pattern and the design pattern on the mask. The existence of this problem limits promotion and application of a surface plasmon lithography technology in related field.

SUMMARY

An aspect of the present disclosure provides a method for correcting a lithography pattern of a surface plasma, including: forming a plurality of test patterns on a test mask, each of the test patterns being characterized by at least a first test parameter and a second test parameter associated with the first test parameter; exposing a photoresist layer by using the test mask containing the test pattern to form a plurality of photoresist patterns, each of the photoresist patterns being characterized by at least a first exposure parameter and a second exposure parameter associated with the first exposure parameter; establishing a first data table based on a correspondence between the first test parameter and the second test parameter of the test pattern and the first exposure parameter and the second exposure parameter of the photoresist pattern; processing the first data table according to the first exposure parameter to obtain a second data table; and respectively correcting second test parameters of a plurality of design patterns according to the second data table to obtain corrected design patterns, and manufacturing a mask for exposure by using the corrected design patterns.

According to embodiments of the present disclosure, at least two test patterns of the plurality of test patterns have the same first test parameter.

According to the embodiments of the present disclosure, the first test parameter is an arrangement period of a line of the test pattern, and the second test parameter is a line width of the line of the test pattern or a spacing between two lines of the test pattern; the first exposure parameter is an arrangement period of a line of the photoresist pattern, and the second exposure parameter is a line width of a line of the photoresist patterns or a spacing between two lines of the photoresist pattern.

According to the embodiments of the present disclosure, the first exposure parameter of each photoresist pattern is the same as a first test parameter of a test pattern corresponding to the photoresist pattern.

According to the embodiments of the present disclosure, the processing the first data table according to the first exposure parameter to obtain a second data table includes: sequentially selecting each test pattern as a target pattern, and searching the first data table for at least two first exposure parameters, wherein the at least two first exposure parameters are the same as a first test parameter of the target pattern; acquiring second exposure parameters associated with the at least two first exposure parameters; selecting a second exposure parameter closest to a second test parameter of the target pattern from all associated second exposure parameters as a preferred second exposure parameter; searching the first data table for a preferred second test parameter, wherein the preferred second test parameter corresponds to a first test parameter same as the first test parameter of the target pattern and corresponds to the preferred second exposure parameter; and establishing the second data table based on the first test parameter, the second test parameter and the preferred second test parameter of all target patterns.

According to the embodiments of the present disclosure, the respectively correcting second test parameters of a plurality of design patterns according to the second data table to obtain corrected design patterns, and manufacturing a mask for exposure by using the corrected design patterns includes: correcting the second test parameter of each design pattern in the second data table to the preferred second test parameter, so as to obtain the corrected design pattern, and making the mask for exposure by using the corrected design pattern.

According to the embodiments of the present disclosure, the plurality of the test patterns are arranged into a one-dimensional periodic test pattern.

According to the embodiments of the present disclosure, the one-dimensional period test pattern includes: a horizontal line periodic pattern or a vertical line periodic pattern.

According to the embodiments of the present disclosure, in the horizontal line period pattern or the vertical line period pattern, an arrangement period of a line is equal to a sum of a line width of the line and a spacing between lines.

According to the embodiments of the present disclosure, the exposing a photoresist layer by using the test mask containing the test pattern to form a plurality of photoresist patterns, each of the photoresist patterns being characterized by at least a first exposure parameter and a second exposure parameter associated with the first exposure parameter includes: exposing the photoresist layer three times by using the test mask containing the test patterns, wherein each exposure forms a plurality of photoresist patterns, and each test pattern of the plurality of test patterns respectively forms three photoresist patterns after three exposures; and taking an average value of first exposure parameters and an average value of second exposure parameters of the three photoresist patterns as a first exposure parameter and a second exposure parameter of a photoresist pattern corresponding to the test pattern.

DESCRIPTION OF SYMBOLS

1 wafer;
2 photoresist layer;
3 metal silver film;
4 polymer material layer;
5 mask;
6 light source.

DETAILED DESCRIPTION OF EMBODIMENTS

Embodiments of the present disclosure will be further described below with reference to the accompanying drawings.

In a traditional lithography technology, a rule-based optical proximity effect may be used to correct various design patterns, and corrected design patterns may be manufactured on a mask. After exposure, an error between an obtained photoresist pattern and the design pattern may be reduced. However, due to a large size range of a pattern that may be effectively exposed by the traditional lithography technology, in a correction process, various patterns that cover all possible corrections need to be designed. If a method of enumerating one by one is used, an amount of data is large and is not within an acceptable range of the amount of data. Even if a table is made, time cost may be increased by using a table look-up method, which is time-consuming and labor-intensive. In consideration of these reasons, traditional lithography usually uses data obtained by fitting to correct the design pattern, which also results in that some corrections may not be supported by actual exposure data.

By using a surface plasmon-based lithography technology, a pattern exposure with a smaller period (such as a 1:1 line with a period of 260 nm) may be achieved with a light source with a larger wavelength (such as 365 nm), and a size range that may be effectively exposed is small. In theory, the design pattern is designed according to a desired target pattern, and a photoresist pattern obtained by exposing a photoresist using a mask with a design pattern should be consistent with the design pattern (the desired target pattern). However, due to a complex principle of plasma lithography and many influence factors, there is an error between the obtained photoresist pattern and the design pattern on the mask, so that the desired target pattern may not be obtained. For this reason, the design pattern is required to be corrected, so that the photoresist pattern obtained based on the corrected design pattern is as consistent as possible with the desired target pattern. All possible corrected patterns involved in the correction process are called test patterns.

According to the embodiments of the present disclosure, based on the desired target pattern, data of all correctable design patterns may be enumerated one by one according to a certain step value at a data node, and the amount of data is within the acceptable range. Further, in the correction process, the design pattern is corrected according to data after an actual exposure, so as to ensure a reliability of the correction. The design pattern is corrected by a table look-up method, which is easy to operate and may accurately reduce an error between the lithography pattern and the desired target pattern.

Figure 1:
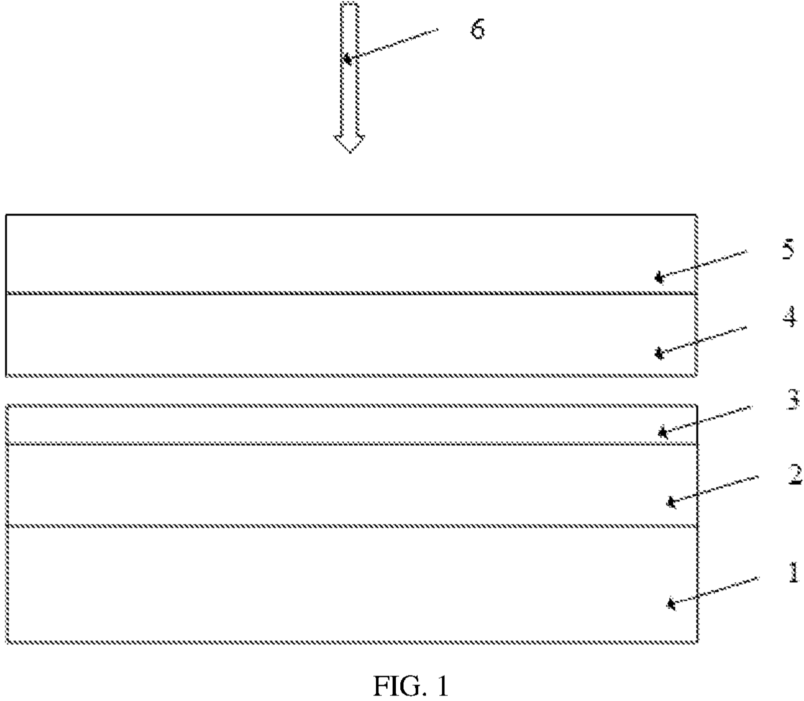
FIG. 1 schematically shows a schematic diagram of a principle of surface plasmon lithography according to embodiments of the present disclosure.

FIG. 1 schematically shows a schematic diagram of a principle of surface plasmon lithography according to embodiments of the present disclosure.

As shown in FIG. 1, light emitted by a light source 6 is irradiated on a test mask 5, and there are a plurality of test patterns to be transferred on the test mask 5. The test pattern is recorded on a photoresist layer 2 through a light wave diffraction system composed of a metal silver film 3 and a polymer material layer 4, and then the same photoresist pattern as the test pattern is obtained on a wafer 1 by a developing and other cleaning steps. The polymer material layer 4 may also be a film layer of other materials.

According to a general inventive concept of the present disclosure, there is provided a method for correcting a lithography pattern of a surface plasma, including: forming a plurality of test patterns on a test mask, each of the test patterns being characterized by at least a first test parameter and a second test parameter associated with the first test parameter; exposing a photoresist layer by using the test mask containing the test patterns to form a plurality of photoresist patterns, each of the photoresist patterns being characterized by at least a first exposure parameter and a second exposure parameter associated with the first exposure parameter; establishing a first data table based on a correspondence between the first test parameter and the second test parameter of the test pattern and the first exposure parameter and the second exposure parameter of the photoresist pattern; processing the first data table according to the first exposure parameter to obtain a second data table; and respectively correcting second test parameters of a plurality of design patterns according to the second data table to obtain corrected design patterns, and manufacturing a mask for exposure by using the corrected design patterns.

Figure 2:
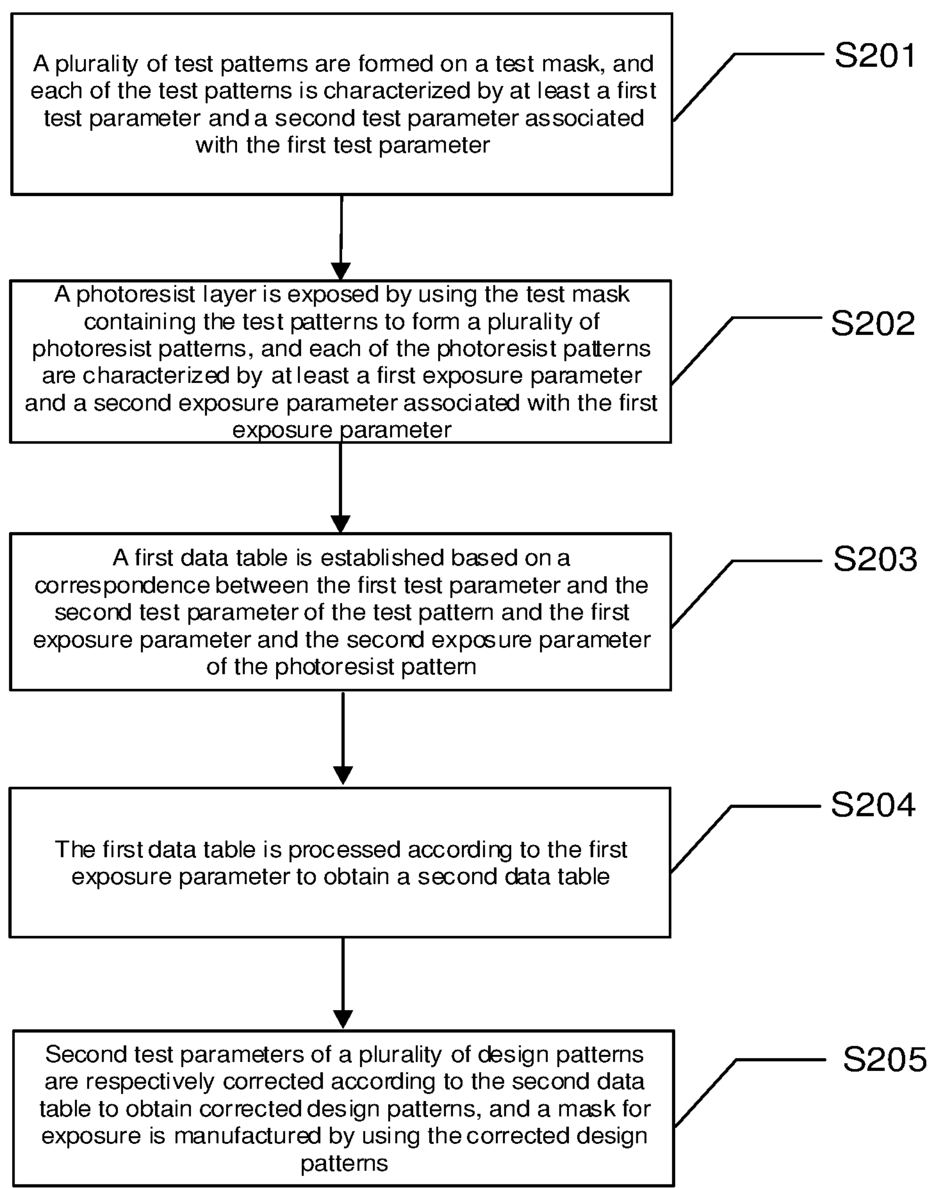
FIG. 2 schematically shows a flowchart of a method for correcting a lithography pattern of a surface plasmon according to the embodiments of the present disclosure.

FIG. 2 schematically shows a flowchart of a method for correcting a lithography pattern of a surface plasmon according to the embodiments of the present disclosure.

As shown in FIG. 2, the method includes step S201 to step S205.

In the step S201, a plurality of test patterns are formed on a test mask, and each of the test patterns is characterized by at least a first test parameter and a second test parameter associated with the first test parameter.

According to the embodiments of the present disclosure, the test pattern may include a one-dimensional periodic test pattern, and the one-dimensional periodic test pattern may further include: a horizontal line periodic pattern and a vertical line periodic pattern. In the horizontal line periodic pattern and the vertical line periodic pattern, an arrangement period of a line is equal to a sum of a line width of the line and a spacing between two lines.

According to the embodiments of the present disclosure, the test pattern covers various patterns with different periods designed with the minimum resolution as a step value according to a line width node of the line. A step value of the minimum resolution may be 1 nm. In a design process, the first test parameter may be a periodic value of line arrangement designed according to the minimum step value; the second test parameter may be a line width of the line or a spacing between two lines. A relationship between the first test parameter and the second test parameter is that the arrangement period of the line is equal to a sum of the line width of the line and the spacing between two lines.

According to the embodiments of the present disclosure, each of the test patterns is characterized by at least the first test parameter and the second test parameter. In the design process, first test parameters of at least two test patterns should be the same, so as to facilitate a determination of a preferred solution based on the same first test parameter from a comparison process. In the present disclosure, taking only the first test parameter of 51 to 53 nm and the second test parameter of 24 to 26 nm as an example, every three test patterns have the same first test parameter. Specific test pattern parameters are shown in Table 1.

TABLE 1

| Test pattern parameter | | |
|---|---|---|
| Parameter name | Second test parameter (line width nm) | First test parameter (period nm) |
| Test pattern parameter | 24 | 51 |
| | 24 | 52 |
| | 24 | 53 |
| | 25 | 51 |
| | 25 | 52 |
| | 25 | 53 |
| | 26 | 51 |
| | 26 | 52 |
| | 26 | 53 |

In the step S202, a photoresist layer is exposed by using the test mask containing the test patterns to form a plurality of photoresist patterns, and each of the photoresist patterns are characterized by at least a first exposure parameter and a second exposure parameter associated with the first exposure parameter.

According to the embodiments of the present disclosure, the test mask containing a plurality of test patterns is obtained by making the plurality of test patterns on a reticle by means of electron beam direct writing. The photoresist layer is exposed three times by using the test mask containing the plurality of test patterns, each exposure forms a plurality of photoresist patterns, and each test pattern of the plurality of test patterns forms three photoresist patterns after three exposures.

According to the embodiments of the present disclosure, an average value of periodic values of the three photoresist patterns for each test pattern is taken as the first exposure parameter corresponding to the first test parameter, and an average value of the line widths or an average value of the spacings between lines of the three photoresist patterns for each test pattern as the second exposure parameter corresponding to the second test parameter. The relationship between the first exposure parameter and the second exposure parameter is that the arrangement period of the line is equal to a sum of the line width of the line and the spacing between two lines.

According to the embodiments of the present disclosure, the first exposure parameter of each photoresist pattern is the same as a first test parameter of a test pattern corresponding to the photoresist pattern. That is, the same test pattern has the same periodic value as that of the photoresist pattern. Photoresist pattern parameters obtained by exposing the photoresist layer using a mask made with the test pattern parameters in Table 1 are shown in Table 2.

TABLE 2

| Photoresist pattern parameter | | |
|---|---|---|
| Parameter name | Second exposure parameter (line width nm) | First exposure parameter (period nm) |
| Photoresist pattern parameter | 8.7 | 51 |
| | 19.1 | 52 |
| | 22.5 | 53 |
| | 15.2 | 51 |
| | 20.6 | 52 |
| | 29.3 | 53 |
| | 20.6 | 51 |
| | 26.0 | 52 |
| | 35.2 | 53 |

In the step S203, a first data table is established based on a correspondence between the first test parameter and the second test parameter of the test pattern and the first exposure parameter and the second exposure parameter of the photoresist pattern.

TABLE 3

| First data table established according to the test pattern parameters and the photoresist pattern parameter | | | | | |
|---|---|---|---|---|---|
| Parameter name | Second test parameter (line width nm) | First test parameter (period nm) | Parameter name | Second exposure parameter (line width nm) | First exposure parameter (period nm) |
| Test pattern parameter | 24 | 51 | Photoresist pattern parameter | 8.7 | 51 |
| | 24 | 52 | | 19.1 | 52 |
| | 24 | 53 | | 22.5 | 53 |
| | 25 | 51 | | 15.2 | 51 |
| | 25 | 52 | | 20.6 | 52 |
| | 25 | 53 | | 29.3 | 53 |
| | 26 | 51 | | 20.6 | 51 |
| | 26 | 52 | | 26.0 | 52 |
| | 26 | 53 | | 35.2 | 53 |

According to the embodiments of the present disclosure, the first data table is established according to a one-to-one correspondence between the first test parameter and the second test parameter of the test pattern and the first exposure parameter and the second exposure parameter of the photoresist pattern. The first data table established according to the test pattern parameter in Table 1 and the photoresist pattern parameter in Table 2 is shown in Table 3.

According to the embodiments of the present disclosure, the establishment of the first data table is convenient, quick, and targeted to calculate an amount of correction for the second test parameter, and a second data table is established according to the calculated amount of correction.

In the S204, the first data table is processed according to the first exposure parameter to obtain a second data table.

According to the embodiments of the present disclosure, each test pattern is sequentially selected as a target pattern, and at least two first exposure parameters that are the same as the first test parameter of the target pattern are searched in the first data table. Second exposure parameters associated with the at least two first exposure parameters are acquired. Taking the test pattern with the first test parameter of 52 nm and the second test parameter of 25 nm as the target pattern in Table 3 as an example, three first test parameters that are the same as the first test parameter of 52 nm are searched in the first data table, and second exposure parameters associated with the three first exposure parameters are 19.1 nm, 20.6 nm and 26 nm, respectively.

According to the embodiments of the present disclosure, a second exposure parameter closest to the second test parameter of the target pattern is selected from all associated second exposure parameters as a preferred second exposure parameter. The second test parameter of the target pattern is 25 nm. Among searched three second exposure parameters, 26 nm is the closest to 25 nm, and thus 26 nm is taken as the preferred second exposure parameter.

According to the embodiments of the present disclosure, a preferred second test parameter is searched in the first data table, and the preferred second test parameter corresponds to a first test parameter same as the first test parameter of the target pattern and corresponds to the preferred second exposure parameter; and the second data table is established based on the first test parameter, the second test parameter and the preferred second test parameter of all target patterns. In the first data table, it is searched that the second test parameter corresponding to the first test parameter of 52 nm and corresponding to the preferred second exposure parameter of 26 nm is 26 nm, that is, 26 nm is the preferred second test parameter. That is, the second test parameter 25 nm of the design pattern corresponding to the desired target pattern is required to be corrected to the preferred second test parameter 26 nm, so that the corrected design pattern to be obtained may be used to manufacture a final exposure mask and obtain the photoresist pattern. The second data table obtained by processing the first data table according to the first exposure parameter is shown in Table 4.

TABLE 4

Second data table obtained by processing the first data table according to the first exposure parameter

| Parameter name | Second test parameter (line width nm) | First test parameter (period nm) | Preferred second test parameter (line width nm) |
|---|---|---|---|
| Design pattern parameter | 24 | 51 | 26 |
| | 24 | 52 | 26 |
| | 24 | 53 | 24 |
| | 25 | 51 | 26 |
| | 25 | 52 | 26 |
| | 25 | 53 | 24 |
| | 26 | 51 | 26 |
| | 26 | 52 | 26 |
| | 26 | 53 | 25 |

According to the embodiments of the present disclosure, the preferred second test parameter may be quickly and efficiently searched in the second data table. The design pattern corresponding to the desired target pattern is effectively corrected, and data are all obtained from experiments, which ensures an accuracy and reliability of the data during the correction process.

In the step S205, second test parameters of a plurality of design patterns are respectively corrected according to the second data table to obtain corrected design patterns, and a mask for exposure is manufactured by using the corrected design patterns.

According to the embodiments of the present disclosure, the second test parameters of each design pattern in the second data table are corrected to the preferred second test parameter so as to obtain the corrected design patterns, and the mask for exposure is manufactured by using the corrected design patterns.

According to the embodiments of the present disclosure, taking the first test parameter of 53 nm and the second test parameter of 25 nm as the desired target pattern as an example, in theory, the first test parameter of the design pattern corresponding to the desired target pattern is 53 nm, and the second test parameter of the design pattern corresponding to the desired target pattern is 25 nm. According to the second data table, it is searched that a corresponding preferred second test parameter is 24 nm, that is, a size of the design pattern is corrected to be 53 nm for the first test parameter and 24 nm for the second test parameter, so as to obtain the corrected design pattern, and the mask for exposure is made by using the corrected design pattern. According to the first data table, it is searched that when the first test parameter is 53 nm and the second test parameter is 24 nm, the first exposure parameter is 53 nm and the second exposure parameter is 22.5 nm in a corresponding photoresist pattern parameter. An error between the second exposure parameter 22.5 nm and the second test parameter 25 nm of the desired target pattern is 2.5 nm.

According to the embodiments of the present disclosure, if the design pattern is not corrected, according to the first data table, when it is searched that a first test parameter of an uncorrected design pattern is 53 nm and a second test parameter of the uncorrected design pattern is 25 nm, the first exposure parameter is 53 nm and the second exposure parameter is 29.3 nm in the corresponding photoresist pattern parameter. An error between the second exposure parameter 29.3 nm and the second test parameter 25 nm of the desired target pattern 4.3 nm, and the error is significantly greater than the corrected error of 2.5 nm.

It may be understood that in the above-mentioned description, the photoresist layer is exposed by using the test mask containing the test patterns, so as to obtain a plurality of photoresist patterns corresponding to the test patterns, and the photoresist layer is exposed by using a mask containing corrected design patterns so as to obtain a plurality of photoresist patterns corresponding to the design patterns. The plurality of photoresist patterns corresponding to the design patterns are as consistent as possible with the desired target patterns.

According to the embodiments of the present disclosure, the test pattern, the plurality of photoresist patterns corresponding to the test pattern, the design pattern, the corrected design pattern, the plurality of photoresist patterns corresponding to the design pattern, and the desired target patterns may all be characterized by the arrangement period of the line, the line width of the line and the spacing between two lines.

According to the embodiments of the present disclosure, the second test parameters of the design patterns are corrected according to the second data table so as to obtain corrected design patterns, and a mask for exposure is manufactured by using the corrected design patterns, which may accurately and effectively reduces an error between the photoresist pattern and the desired target pattern. A subsequent procedure such as an exposure may be performed under the same exposure condition.

According to the above-mentioned embodiments of the present disclosure, there is provided a method for correcting a lithography pattern of a surface plasmon. The method for correcting a lithography pattern of a surface plasmon provided by the present disclosure may be targeted to correct the lithography pattern in a short time by using a table look-up method, so as to accurately reduce an error between the lithography pattern and the target pattern. The method is simple, time-saving, labor-saving, accurate and efficient. Data in data tables are all obtained from experiments. Compared with experimental data obtained by fitting, the method for correcting a lithography pattern of a surface plasma provided by the present disclosure may ensure a reliability of pattern correction and is more conducive to the promotion and application of surface plasma lithography in related fields.

The parameters in the above-mentioned tables and the parameters in the examples are only an embodiment of the present application, and listed for ease of understanding, which does not mean that the present application is only applicable to the above-mentioned parameters. In an actual working process, corresponding parameter ranges are also different according to different parameters that may be made by different structures and materials in a process of plasma lithography.

The above-mentioned specific embodiments of the present disclosure are not intended to limit the scope of protection of the present disclosure. Any other corresponding changes and modifications made according to the technical concept of the present disclosure should all be included within the scope of protection of the claims of the present disclosure.

What is claimed is:

1. A method for correcting a lithography pattern of a surface plasma, comprising:

forming a plurality of test patterns on a test mask, each of the test patterns being characterized by at least a first test parameter and a second test parameter associated with the first test parameter;

exposing a photoresist layer by using the test mask containing the test patterns to form a plurality of photoresist patterns, each of the photoresist patterns being characterized by at least a first exposure parameter and a second exposure parameter associated with the first exposure parameter;

establishing a first data table based on a correspondence between the first test parameter and the second test parameter of the test pattern and the first exposure parameter and the second exposure parameter of the photoresist pattern;

processing the first data table according to the first exposure parameter to obtain a second data table; and respectively correcting second test parameters of a plurality of design patterns according to the second data table to obtain corrected design patterns, and manufacturing a mask for exposure by using the corrected design patterns, wherein the first exposure parameter of each photoresist pattern is the same as a first test parameter of a test pattern corresponding to the photoresist pattern, wherein the processing the first data table according to the first exposure parameter to obtain a second data table comprises:

sequentially selecting each test pattern as a target pattern, and searching the first data table for at least two first exposure parameters, wherein the at least two first exposure parameters are the same as a first test parameter of the target pattern;

acquiring second exposure parameters associated with the at least two first exposure parameters;

selecting a second exposure parameter closest to a second test parameter of the target pattern from all associated second exposure parameters as a preferred second exposure parameter;

searching the first data table for a preferred second test parameter, wherein the preferred second test parameter corresponds to a first test parameter same as the first test parameter of the target pattern and corresponds to the preferred second exposure parameter; and establishing the second data table based on the first test parameter, the second test parameter and the preferred second test parameter of all target patterns.

2. The method according to claim 1, wherein at least two test patterns of the plurality of test patterns have a same first test parameter.

3. The method according to claim 1, wherein the first test parameter is an arrangement period of a line of the test pattern, and the second test parameter is a line width of a line of the test pattern or a spacing between two lines of the test pattern;

the first exposure parameter is an arrangement period of a line of the photoresist pattern, and the second exposure parameter is a line width of a line of the photoresist pattern or a spacing between two lines of the photoresist pattern.

4. The method according to claim 3, wherein the plurality of the test patterns are arranged into a one-dimensional periodic test pattern.

5. The method according to claim 4, wherein the one-dimensional period test pattern comprises: a horizontal line periodic pattern or a vertical line periodic pattern.

6. The method according to claim 5, wherein, in the horizontal line period pattern or the vertical line period pattern, an arrangement period of a line is equal to a sum of a line width of the line and a spacing between lines.

7. The method according to claim 1, wherein the respectively correcting second test parameters of a plurality of design patterns according to the second data table to obtain corrected design patterns and manufacturing a mask for exposure by using the corrected design patterns comprises:

correcting the second test parameter of each design pattern in the second data table to the preferred second test parameter, so as to obtain the corrected design pattern, and manufacturing the mask for exposure by using the corrected design pattern.

8. The method according to claim 1, wherein the exposing a photoresist layer by using the test mask containing the test patterns to form a plurality of photoresist patterns, each of the photoresist patterns being characterized by at least a first exposure parameter and a second exposure parameter associated with the first exposure parameter comprises:

exposing the photoresist layer three times by using the test mask containing the test patterns, wherein each exposure forms a plurality of photoresist patterns, and each test pattern of the plurality of test patterns respectively forms three photoresist patterns after three exposures; and taking an average value of first exposure parameters and an average value of second exposure parameters of the three photoresist patterns as a first exposure parameter and a second exposure parameter of a photoresist pattern corresponding to the test pattern.

* * * * *